United States Patent
Lin et al.

(10) Patent No.: US 12,089,326 B2
(45) Date of Patent: Sep. 10, 2024

(54) DOUBLE-SIDED FLEXIBLE CIRCUIT BOARD

(71) Applicant: CHIPBOND TECHNOLOGY CORPORATION, Hsinchu (TW)

(72) Inventors: Yin-Chen Lin, Miaoli County (TW); Hui-Yu Huang, Hsinchu (TW); Chih-Ming Peng, Taichung (TW); Chun-Te Lee, Hsinchu County (TW)

(73) Assignee: CHIPBOND TECHNOLOGY CORPORATION, Hsinchu (TW)

( * ) Notice: Subject to any disclaimer, the term of this patent is extended or adjusted under 35 U.S.C. 154(b) by 145 days.

(21) Appl. No.: 17/741,543

(22) Filed: May 11, 2022

(65) Prior Publication Data
US 2023/0039895 A1 Feb. 9, 2023

(30) Foreign Application Priority Data

Aug. 9, 2021 (TW) .................................. 110129352

(51) Int. Cl.
  *H05K 1/11* (2006.01)
  *H05K 1/02* (2006.01)
  *H05K 1/18* (2006.01)

(52) U.S. Cl.
  CPC .......... *H05K 1/0298* (2013.01); *H05K 1/115* (2013.01); *H05K 1/118* (2013.01); *H05K 1/111* (2013.01);
  (Continued)

(58) Field of Classification Search
  CPC ...... H05K 1/0298; H05K 1/115; H05K 1/118; H05K 1/189; H05K 2201/09409;
  (Continued)

(56) References Cited

U.S. PATENT DOCUMENTS 7,932,470 B2 * 4/2011 Kurihara .......... H01L 23/49572
174/254
2015/0382445 A1 12/2015 Choi
(Continued)

FOREIGN PATENT DOCUMENTS

CN 113163595 A 7/2021
JP 2000-77484 A 3/2000
(Continued)

OTHER PUBLICATIONS

Taiwan Notice of Allowance mailed Apr. 18, 2022 for Taiwanese Patent Application No. 110129352, 3 pages.
(Continued)

*Primary Examiner* — Ishwarbhai B Patel
(74) *Attorney, Agent, or Firm* — Demian K. Jackson; Jackson IPG PLLC

(57) ABSTRACT

A double-sided flexible circuit board includes a flexible substrate, through circuit lines, first circuit lines and second circuit lines. The first circuit lines are formed on a top surface of the flexible substrate and each includes a first segment, a bent segment and a second segment. One end of the first segment is connected to a first connection end of one of the through circuit lines. Both ends of the bent segment are connected to the other end of the first segment and one end of the second segment, respectively. A second distance between the adjacent second segments is greater than a first distance between the adjacent first segments. The second circuit lines are formed on a bottom surface of the flexible substrate and each is connected to a second connection end of one of the through circuit lines.

8 Claims, 3 Drawing Sheets

(52) U.S. Cl.
CPC ... *H05K 1/189* (2013.01); *H05K 2201/10674* (2013.01)

(58) Field of Classification Search
CPC .......... H05K 2201/09709; H05K 2201/10674; H05K 2201/10681; H05K 2203/0228; H05K 3/005; H05K 1/09; H05K 1/111
See application file for complete search history.

(56) References Cited

U.S. PATENT DOCUMENTS

| | | | | |
|---|---|---|---|---|
| 2016/0197020 | A1* | 7/2016 | Lim | H01L 24/09 257/774 |
| 2020/0375028 | A1* | 11/2020 | Lee | H05K 1/115 |
| 2022/0039262 | A1* | 2/2022 | Umeyama | G01L 9/0041 |

FOREIGN PATENT DOCUMENTS

| | | |
|---|---|---|
| JP | 2002-118339 A | 4/2002 |
| JP | 2017-37988 A | 2/2017 |
| JP | 2019-121644 A | 7/2019 |
| KR | 10-2008-0085443 A | 9/2008 |
| KR | 10-2013-0086464 A | 8/2013 |
| KR | 10-2016-0091595 A | 8/2016 |

OTHER PUBLICATIONS

Japanese Office Action mailed Jul. 3, 2023 for Japanese Patent Application No. 2022-106095, 2 pages.

* cited by examiner

DOUBLE-SIDED FLEXIBLE CIRCUIT BOARD

FIELD OF THE INVENTION

This invention relates to a flexible circuit board, and more particularly to a double-sided flexible circuit board.

BACKGROUND OF THE INVENTION

Flexible circuit board is usually used in mobile devices, e.g. smart phone, laptop and tablet, because it is small and lightweight. Conventional flexible circuit board includes a flexible substrate, a chip and single-layer patterned circuit lines. With the development of advanced process of integrated circuits, more and more circuit lines and corresponding output and input conductive pads are required on a same-size chip, or outer leads disposed on the bottom surface of the flexible substrate are desired because of space limitations, accordingly, single-layer patterned circuit lines are not enough. Double-sided flexible circuit board is the current focus, patterned circuit lines on top and bottom surfaces of the flexible substrate allows the output and input conductive pads of the chip to be connected to outside. Through holes in the flexible substrate and through circuit lines in the through holes are necessary to allow the circuit lines on the top surface to run to the bottom surface, however, it makes smaller distance between the adjacent circuit lines. The circuit lines located on the cutting line may be shifted as cutting the flexible circuit board, and short circuit of the circuit lines may occur because the distance between the adjacent circuit lines is too small.

SUMMARY

One object of the present invention is to provide first circuit lines each including a first segment, a bent segment and a second segment, the design of the bent segment allows the distance between the adjacent second segments to be greater than the distance between the adjacent first segments so as to prevent shift and short circuit of the second segment passing through a cutting line during cutting process.

A double-sided flexible circuit board of the present invention includes a flexible substrate, a plurality of through circuit lines, a plurality of first circuit lines and a plurality of second circuit lines. The flexible substrate includes a top surface, a bottom surface, a plurality of through holes and a cutting line, the through holes communicate the top and bottom surfaces, an area enclosed by the cutting line is defined as a working area, and the other area outside the cutting line is defined as a nonworking area. The flexible substrate is cut along the cutting line in a cutting process, and the working area is separated from the flexible substrate as an integrated circuit. Each of the through circuit lines is located in one of the through holes, a first connection end and a second connection end of each of the through circuit lines are visible on the top surface and the bottom surface, respectively. The first circuit lines are formed on the top surface and each includes a first segment, a bent segment and a second segment. The first segment and the bent segment are located on the working area, and the second segment is located both on the working area and the nonworking area. One end of the first segment of each of the circuit lines is connected to the first connection end of one of the through lines, the other end of the first segment is connected to one end of the bent segment, the other end of the bent segment is connected to one end of the second segment, and the other end of the second segment is located on the nonworking area. There is a first distance between the first segment of the two adjacent first circuit lines and a second distance between the second segment of the two adjacent first circuit lines, the second distance is greater than the first distance. The second circuit lines are formed on the bottom surface and located on the working area, each of the second circuit lines is connected to the second connection end of one of the through circuit lines.

The first circuit lines on the top surface can be electrically connected to the second circuit lines on the bottom surface by the through circuit lines. The design of the bent segment of each of the first circuit lines allows the second distance between the second segment of the adjacent first circuit lines to be greater than the first distance between the first segment of the adjacent first circuit lines, as a result, a risk of short circuit, induced by shift of the second segment across the cutting line during cutting process, is reduced.

DETAILED DESCRIPTION OF THE INVENTION

Figure 1:
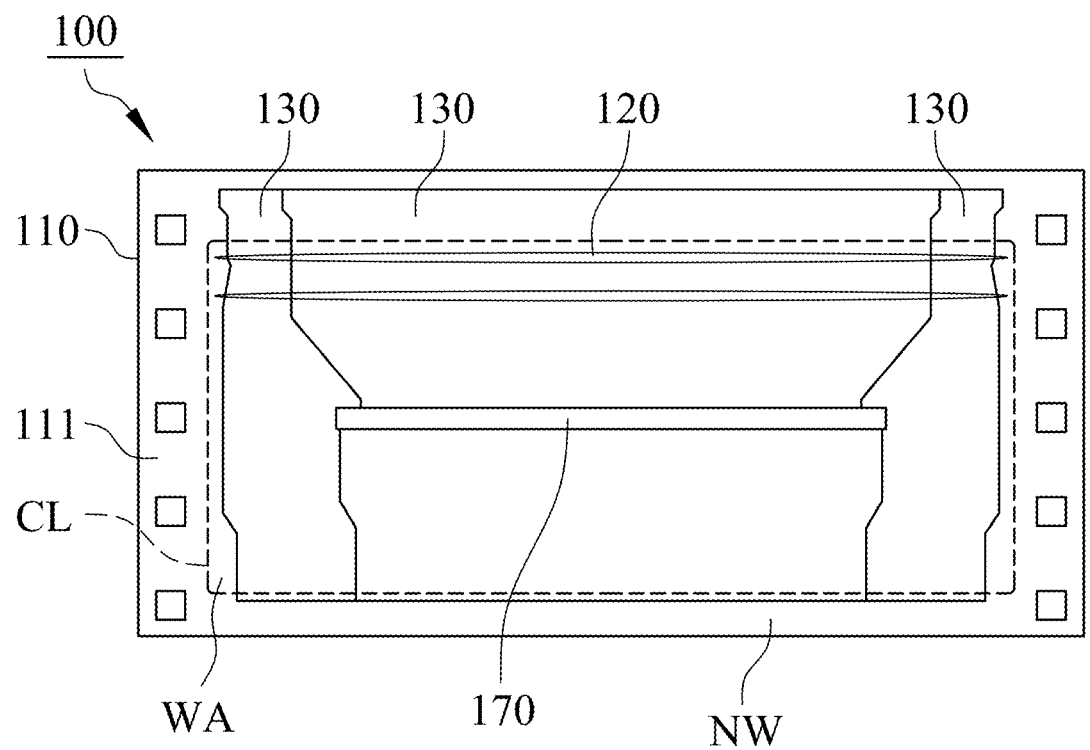
FIG. 1 is a top-view diagram illustrating a double-sided flexible circuit board in accordance with one embodiment of the present invention.
Figure 2:
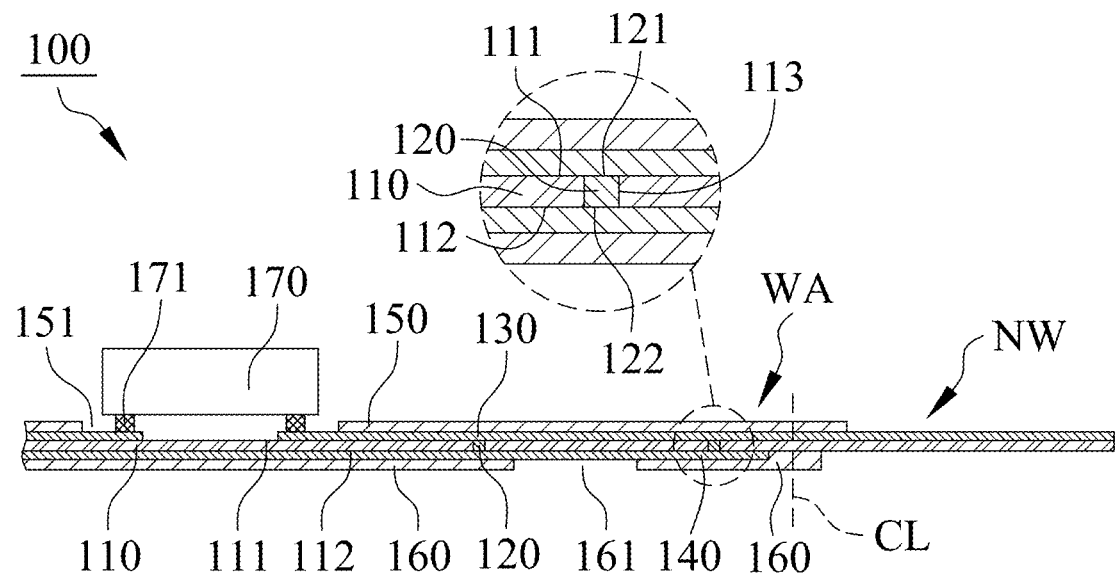
FIG. 2 is a cross-section view diagram illustrating the double-sided flexible circuit board in accordance with one embodiment of the present invention.

FIGS. 1 and 2 are respectively the top view diagram and the partial cross-section view diagram showing a double-sided flexible circuit board 100 in accordance with one embodiment of the present invention. The double-sided flexible circuit board 100 includes a flexible substrate 110, a plurality of through circuit lines 120, a plurality of first circuit lines 130, a plurality of second circuit lines 140, a first solder resist layer 150, a second solder resist layer 160 and a chip 170. The first circuit lines 130 are formed on a top surface 111 of the flexible substrate 110, and the second circuit lines 140 are formed on a bottom surface 112 of the flexible substrate 110. The first circuit lines 130 are covered by the first solder resist layer 150, and a part of the first circuit lines 130 are visible from a first opening 151 on the first solder resist layer 150. In this embodiment, the visible part of the first circuit lines 130 are inner leads of the double-sided flexible circuit board 100. The chip 170 is bonded to the visible part of the first circuit lines 130 using a plurality of bumps 171 for signal transmission. The second circuit lines 140 are covered by the second solder resist layer 160, and a part of the second circuit lines 140 are visible from a second opening 161 on the second solder resist layer 160. In this embodiment, the visible part of the second circuit lines 140 are outer leads of the double-sided flexible circuit board 100 which are used for electrical connection between the double-sided flexible circuit board 100 and electron device (not shown). The through circuit lines 120 and the first circuit lines 130 shown in FIG. 1 are simplified, in practice, they are vertical tiny lines and horizontal tiny lines, respectively.

In this embodiment, the flexible substrate 110 is made of polymer material having excellent electric insulation, stability, chemical resistance and mechanical behavior, such as polyimide. A plurality of through holes 113 are formed in the flexible substrate 110 to communicate the top surface 111 and the bottom surface 112 of the flexible substrate 110. A cutting line CL is defined on the flexible substrate 110 to separate the flexible substrate 110 into a working area WA and a nonworking area NW. The area enclosed by the cutting line CL is defined as the working area WA, and the other area outside the cutting line CL is defined as the nonworking area NW. The flexible substrate 110 is cut along the cutting line CL in a cutting process, and the working area WA separated from the flexible substrate 110 becomes an integrated circuit.

With reference to FIG. 2, each of the through circuit lines 120 is located in one of the through holes 113, a first connection end 121 and a second connection end 122 of each of the through circuit lines 120 are visible on the top surface 111 and the bottom surface 112 of the flexible substrate 110, respectively. After forming the through holes 113 in the flexible substrate 110, preferably, copper is plated in the through holes 113 to become the through circuit lines 120.

With reference to FIGS. 1 and 2, the copper layers plated on the top surface 111 and the bottom surface 112 of the flexible substrate 110 are etched to form the first circuit lines 130 and the second circuit lines 140, the solder resist ink is screen-printed on the first circuit lines 130 and the second circuit lines 140 and baked to become the first solder resist layer 150 and the second solder resist layer 160, and the chip 170 is flip-bonded to the visible part of the first circuit lines 130.

Figure 3:
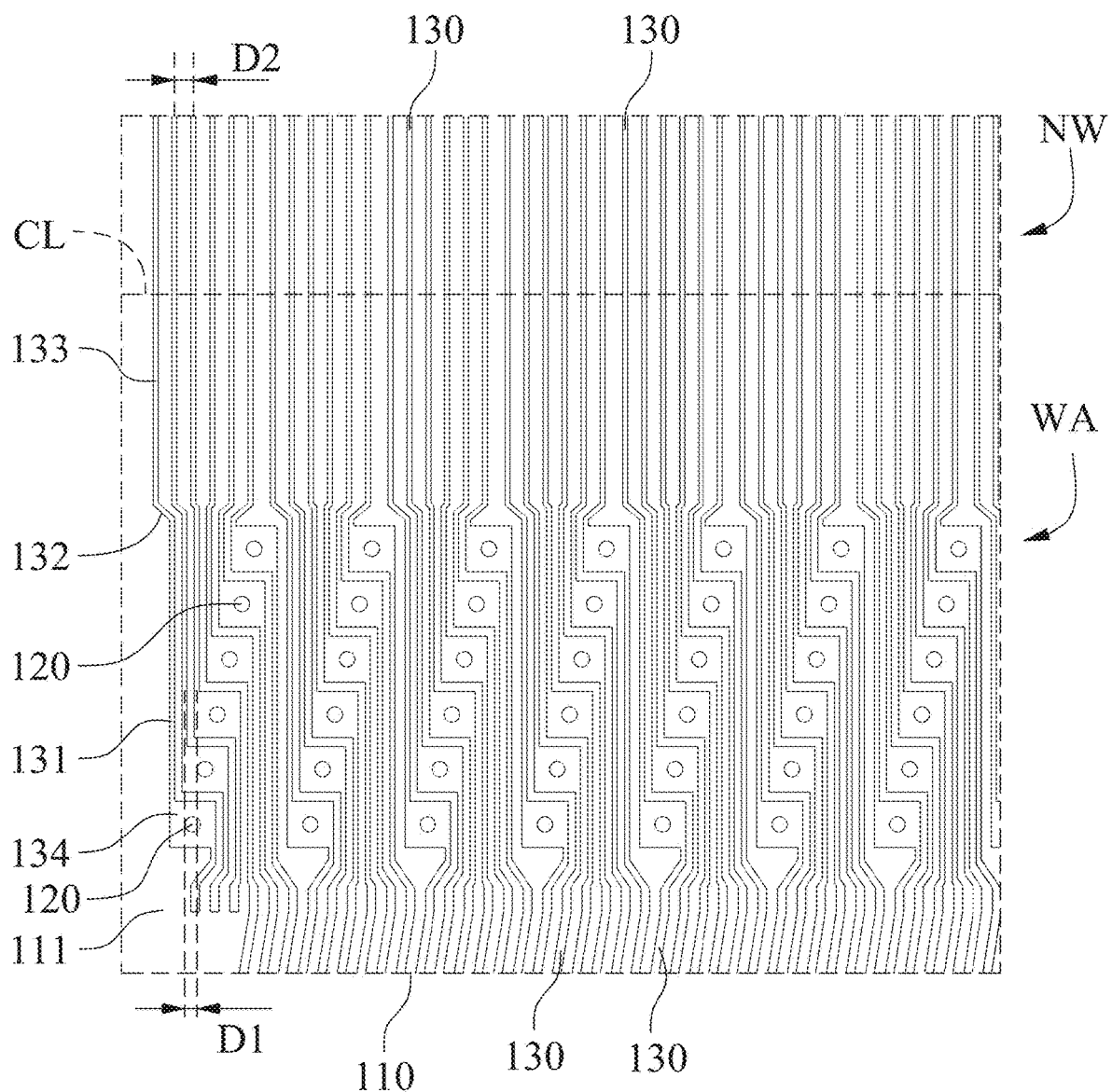
FIG. 3 is a partial enlarged top-view diagram illustrating the double-sided flexible circuit board in accordance with one embodiment of the present invention.

With reference to FIG. 3, each of the first circuit lines 130 includes a first segment 131, a bent segment 132 and a second segment 133, the first segment 131 and the bent segment 132 are located on the working area WA, and the second segment 133 is located both on the working area WA and the nonworking area NW. Both ends of the first segment 131 of each of the first circuit lines 130 are connected to the first connection end 121 of one of the through circuit lines 120 and one end of the bent segment 132, respectively, the other end of the bent segment 132 is connected to one end of the second segment 133, the other end of the second segment 133 is located on the nonworking area NW. Accordingly, the cutting line CL is designed to pass through the second segment 133. The first segment 131, the bent segment 132 and the second segment 133 of the same first circuit line 130 have the same width between 8 um and 16 um.

In this embodiment, there is a first conductive pad 134 located at one end of each of the first circuit lines 130. The first conductive pad 134 of each of the first circuit lines 130 is connected to the first connection end 121 of one of the through circuit lines 120 and one end of the first segment 131, in other words, one end of the first segment 131 of each of the first circuit lines 130 is connected to the first connection end 121 of one of the through circuit lines 120 via the first conductive pad 134. The first conductive pads 134 of the first circuit lines 130 are provided for electrical connection between the first circuit lines 130 and the through circuit lines 120. Because of the first conductive pads 134, a first distance D1 between the two adjacent first segments 131 is tiny. In this embodiment, the first distance D1 between the two adjacent first segments 131 is greater than or equal to 18 um and less than 50 um. In different embodiments, each of the first circuit lines 130 may not include the first conductive pad 134 and may be directly electrically connected to the first connection end 121 of one of the through circuit lines 120 using its one end.

With reference to FIG. 3, the first circuit lines 130 are parallel to the second circuit lines 140, and the bent segments 132 are oblique with respect to the first segments 131 and the second segments 133. Accordingly, the bent segments 132 are provided to allow a second distance D2 between the two adjacent second segments 133 to be greater than the first distance D1 between the two adjacent first segments 131.

Preferably, the second distance D2 between the two adjacent second segments 133 is between 22 um and 50 um. The second segments 133 are located both on the working area WA and the nonworking area NW, as a result, the cutting line CL passes through the second segments 133, and the second segments 133 are also cut and may be shifted during the cutting process along the cutting line CL. Owing to the bent segments 132 of the first circuit lines 130, the second distance D2 between the two adjacent second segments 133 is great enough to avoid short circuit conditions caused by the contacting of the shifted second segments 133.

Figure 4:
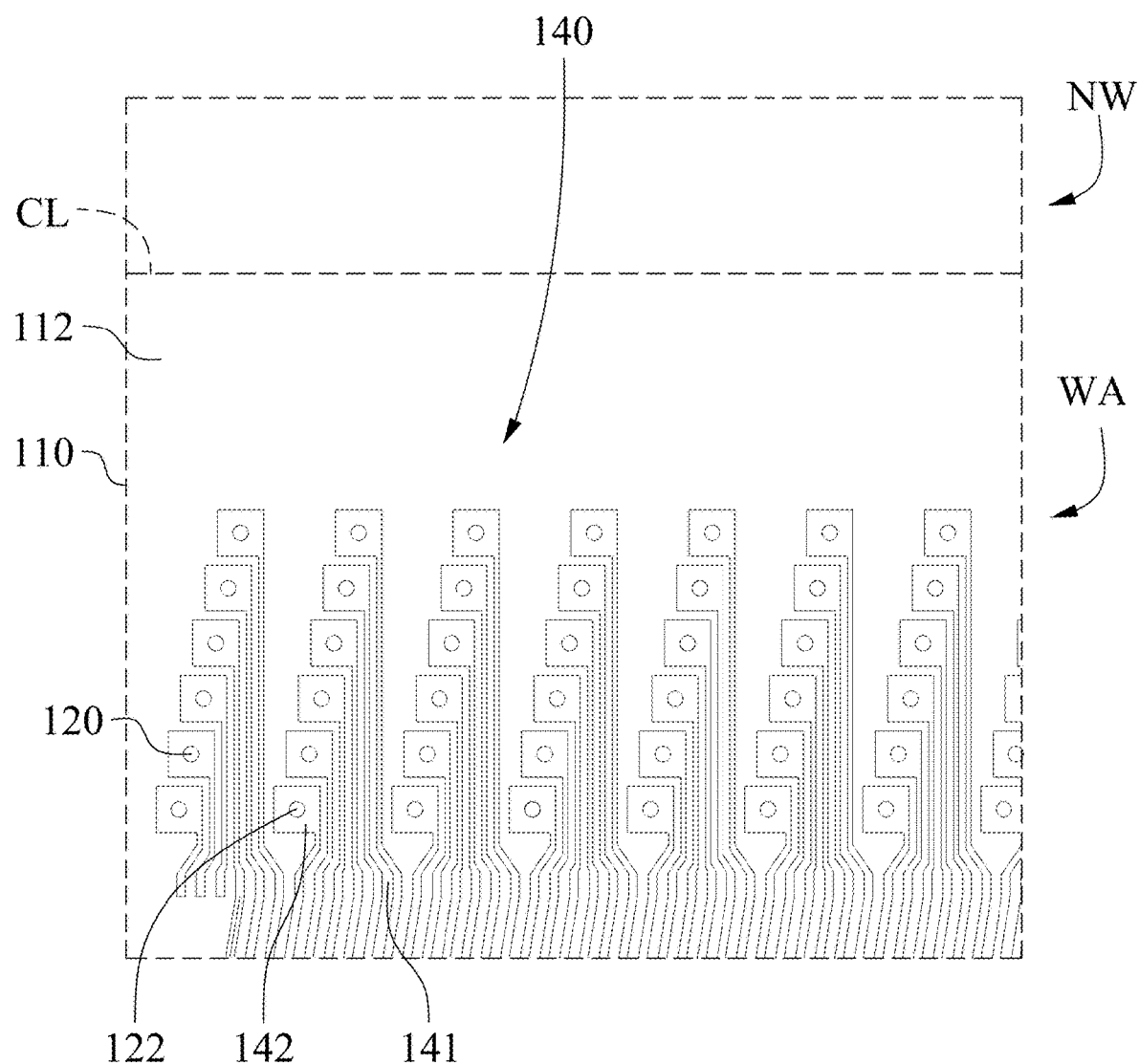
FIG. 4 is a partial enlarged bottom-view diagram illustrating the double-sided flexible circuit board in accordance with one embodiment of the present invention.

FIG. 4 is a partial enlarged bottom-view diagram showing the double-sided flexible circuit board 100. In this embodiment, the second circuit lines 140 are located on the working area WA and each of them is connected to the second connection end 122 of one of the through circuit lines 120. Preferably, each of the second circuit lines 140 includes a third segment 141 and a second conductive pad 142. The second conductive pad 142 of each of the second circuit lines 140 is connected to the second connection end 122 of one of the through circuit lines 120 and one end of the third segment 141, in other words, one end of the third segment 141 of each of the second circuit lines 140 is connected to the second connection end 122 of one of the through circuit lines 120 via the second conductive pad 142. The second conductive pads 142 of the second circuit lines 140 are provided for electrical connection of the second circuit lines 140 to the through circuit lines 120. With reference to FIGS. 2, 3 and 4, transmission signals from the chip 170 can be transmitted to the bottom surface 112 of the flexible substrate 110 by the through circuit lines 120, consequently, the double-sided flexible circuit board 100 can be used flexibly because its outer leads can be disposed on a surface different to where the chip 170 is mounted on.

Because of the through circuit lines 120, the first circuit lines 130 on the top surface 111 can be electrically connected to the second circuit lines 140 on the bottom surface 112. Furthermore, the design of the bent segment 132 of each of the first circuit lines 130 allows the second distance D2 between the two adjacent second segments 133 to be greater than the first distance D1 between the two adjacent first segments 131. Consequently, it is possible to prevent short circuit conditions resulted from the shift of the second segments 133 located on the cutting line CL during the cutting process.

While this invention has been particularly illustrated and described in detail with respect to the preferred embodiments thereof, it will be clearly understood by those skilled in the art that is not limited to the specific features shown and described and various modified and changed in form and details may be made without departing from the scope of the claims.

What is claimed is:

1. A double-sided flexible circuit board comprising:
    a flexible substrate including a top surface, a bottom surface, a plurality of through holes and a cutting line, the plurality of through holes are configured to communicate the top and bottom surfaces, an area enclosed by the cutting line is defined as a working area, and an area outside the cutting line is defined as a nonworking area, the flexible substrate is configured to be cut along the cutting line during a cutting process, the working area is configured to be separated from the flexible substrate as an integrated circuit;

a plurality of through circuit lines each located in one of the plurality of through holes, a first connection end of each of the plurality of through circuit lines is visible on the top surface, and a second connection end of each of the plurality of through circuit lines is visible on the bottom surface;

a plurality of first circuit lines formed on the top surface and each including a first segment, a bent segment and a second segment, the first segment and the bent segment are located on the working area, the second segment is located both on the working area and the nonworking area, one end of the first segment of each of the plurality of first circuit lines is connected to the first connection end of one of the plurality of through circuit lines, the other end of the first segment of each of the plurality of first circuit lines is connected to one end of the bent segment of one of the plurality of through circuit lines, the other end of the bent segment is connected to one end of the second segment, the other end of the second segment is located on the nonworking area, wherein there is a first distance between the first segment of the two adjacent first circuit lines and a second distance between the second segment of the two adjacent first circuit lines, the second distance is greater than the first distance; and a plurality of second circuit lines formed on the bottom surface and located on the working area, each of the plurality of second circuit lines is connected to the second connection end of one of the plurality of through circuit lines;

wherein the first distance is greater than or equal to 18 μm and less than 50 μm, and wherein the second distance is between 22 μm and 50 μm.

2. The double-sided flexible circuit board in accordance with claim 1, wherein the plurality of first circuit lines are parallel to the plurality of second circuit lines.

3. The double-sided flexible circuit board in accordance with claim 2, wherein the bent segment is oblique with respect to the first segment and the second segment.

4. The double-sided flexible circuit board in accordance with claim 1, wherein the plurality of first circuit lines are parallel to the plurality of second circuit lines.

5. The double-sided flexible circuit board in accordance with claim 4, wherein the bent segment is oblique with respect to the first segment and the second segment.

6. The double-sided flexible circuit board in accordance with claim 1, wherein the first segment and the second segment have the same width which is between 8 um and 16 um.

7. The double-sided flexible circuit board in accordance with claim 1, wherein there is a first conductive pad at one end of each of the plurality of first circuit lines, the first conductive pad of each of the plurality of first circuit lines is connected to the first connection end of one of the plurality of through circuit lines and one end of the first segment of one of the plurality of first circuit lines.

8. The double-sided flexible circuit board in accordance with claim 7, wherein each of the plurality of second circuit lines includes a third segment and a second conductive pad, the second conductive pad of each of the plurality of second circuit lines is connected to the second connection end of one of the plurality of through circuit lines and one end of the third segment of one of the plurality of second circuit lines.

* * * * *